United States Patent
Luethge et al.

(10) Patent No.: US 8,137,794 B2
(45) Date of Patent: *Mar. 20, 2012

(54) TRANSPARENT ELECTRICALLY CONDUCTIVE LAYER, A PROCESS FOR PRODUCING THE LAYER AND ITS USE

(75) Inventors: Thomas Luethge, Dortmund (DE); Rita Fuegemann, Marl (DE); Martina Inhester, Bottrop (DE); Matthias Driess, Berlin (DE); Yilmaz Aksu, Berlin (DE)

(73) Assignee: Evonik Degussa GmbH, Essen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/894,630

(22) Filed: Sep. 30, 2010

(65) Prior Publication Data

US 2011/0014437 A1    Jan. 20, 2011

Related U.S. Application Data

(63) Continuation of application No. 11/778,181, filed on Jul. 16, 2007, now Pat. No. 7,867,606.

(30) Foreign Application Priority Data

Mar. 20, 2007    (DE) .......................... 102007013181

(51) Int. Cl.
B32B 3/10    (2006.01)
B32B 17/06   (2006.01)
B32B 15/04   (2006.01)
B32B 21/04   (2006.01)
B32B 27/06   (2006.01)
B32B 29/00   (2006.01)
B05D 3/06    (2006.01)
C07F 7/00    (2006.01)

(52) U.S. Cl. .............. 428/195.1; 428/426; 428/537.1; 428/457; 428/537.5; 428/22; 556/28

(58) Field of Classification Search .............. 428/220, 428/411.1, 412, 432, 457; 427/331
See application file for complete search history.

(56) References Cited

U.S. PATENT DOCUMENTS

| | | | |
|---|---|---|---|
| 4,238,276 A | 12/1980 | Kinugawa et al. | |
| 4,619,704 A | 10/1986 | Hashimoto et al. | |
| 4,859,499 A | 8/1989 | Sauvinet et al. | |
| 5,662,962 A | 9/1997 | Kawata et al. | |
| 5,993,894 A | 11/1999 | Den Boer et al. | |
| 5,993,973 A | 11/1999 | Lee et al. | |
| 6,025,037 A | 2/2000 | Wadman et al. | |
| 6,235,260 B1 | 5/2001 | Toki et al. | |
| 6,511,614 B1 | 1/2003 | Yukinobu et al. | |
| 2003/0207093 A1* | 11/2003 | Tsuji et al. | 428/209 |
| 2004/0135166 A1 | 7/2004 | Yamada et al. | |
| 2004/0211941 A1* | 10/2004 | Miyoshi | 252/500 |
| 2005/0153149 A1* | 7/2005 | Sakane et al. | 428/534 |

FOREIGN PATENT DOCUMENTS

| | | |
|---|---|---|
| DE | 197 54 664 C2 | 9/1998 |
| DE | 199 40 458 A1 | 3/2001 |
| EP | 0 148 608 B1 | 7/1985 |
| EP | 0 192 009 B1 | 8/1986 |
| JP | 54-9792 | 1/1979 |
| JP | 61-9467 | 1/1986 |
| JP | 2-126511 | 5/1990 |
| JP | 2-192616 | 7/1990 |
| JP | 05-314820 A | 11/1993 |
| JP | 06-175144 A | 6/1994 |
| JP | 2001-279137 A | 10/2001 |
| KR | 2003047275 A * | 6/2003 |
| WO | WO 95/29501 | 11/1995 |
| WO | WO 98/49112 | 11/1998 |
| WO | 9854094 | 12/1998 |
| WO | WO 9854094 A1 * | 12/1998 |
| WO | WO 03/004571 A2 | 1/2003 |

OTHER PUBLICATIONS

Veith, Michael, One-dimensional arrangements of metal atoms in transition metal carbonyl complexes of mixed main group metal alkoxides, 1994 (no month), Coordination Chemistry Reviews, 137, pp. 297-322.*
Boegat, D., The First Mixed-Valence Fluorotin Alkoxides: New Sol-Gel Precursors of Fluorine-Doped Tin Oxide Materials, Jul. 21, 2000, ACS Publications, vol. 39, pp. 3924-3927.*
Machine_English_Translation_KR_2003047275_A; Transparent conductive compound and printing method of forming transparent conductive electrode for display panel; Jun. 2003; KIPO; whole document.*
M. Veith, et al., Angew. Chem. Int. Ed. Engl., vol. 30, No. 1, pp. 95-97, 1991 (XP009098376).
M. Veith, et al., Coordination Chemistry Reviews, vol. 137, pp. 297-322, 1994 (XP009098231).
DJ Teff, et al., Inorg. Chem, vol. 37, pp. 2547-2553, 1998 (XP-002475153).
M. Veith, et al., Z. Anorg. Allg. Chem., vol. 627, pp. 1495-1504, 2001 (XP-002475152).

(Continued)

*Primary Examiner* — David Sample
*Assistant Examiner* — Tahseen N Khan
(74) *Attorney, Agent, or Firm* — Oblon, Spivak, McClelland, Maier & Neustadt, L.L.P.

(57)    ABSTRACT

Transparent, electrically conductive layer, a process for producing the layer and its use, wherein the layer is based on at least one compound of the formula 1

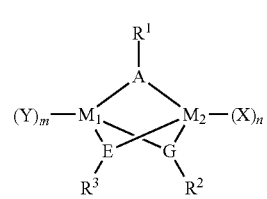

wherein the substituents are as defined.

70 Claims, No Drawings

OTHER PUBLICATIONS

Din EN 13523-4, hat den Status einer Deutchen Norm., pp. 1-6 (2001).

M.A. Aegerter, et al., Journal of Sol-Gel Science and Technology, vol. 27, pp. 81-89 (2003).

Veith, Michael, One-dimensional arrangements of metal atoms in transition metal carbonyl complexes of mixed main group metal alkoxides, 1994 (no month), Coordination Chemistry Reviews, 137, pp. 297-322.

Boegat, D., The First Mixed-Valence Fluorotin Alkoxides: New Sol-Gel Precursors of Fluorine-Doped Tin Oxide Materials, Jul. 21, 2000, ACS Publications, vol. 39, pp. 3924-3927.

"http://en.wikipedia.org/wiki/Sublimation_(phase_transition)", Jan. 3, 2011.

M. Veith et al. "Alkoxigermanates(II),-stannate(II) and -plumbates of Two-Valent Metal Ions, I[1]", Z. Naturforsch., Teil B, 46, pp. 403-424 (1991).

K. G. Caulton et al. "Syntheisis, Structural Principles, and Reactivity of Heterometallic Alkoxides", Chem. Rev., 90, pp. 969-995 (1990).

R.C. Mehrotra "Transition-Metal Alkoxides", Advances in Inorganic Chemistry and Radiochemistry, vol. 26, pp. 269-335 (1983).

D. Bradley "Metal Alkoxides as Precursors for Electronic and Ceramic Materials", Chem. Rev., 89, pp. 1317-1322 (1989).

\* cited by examiner

TRANSPARENT ELECTRICALLY CONDUCTIVE LAYER, A PROCESS FOR PRODUCING THE LAYER AND ITS USE

BACKGROUND OF THE INVENTION

1. Field of the Invention

The present invention relates to a transparent, electrically conductive layer, to a process for producing the layer and to its use.

2. Description of the Background

Transparent layers with high ohmic conductivity have areal resistances of at most $1000\Omega/\square$ to and a transmission of over 70% and are required in all modern displays, for example in LCDs, plasma displays, OLEDs, and, for example, also in organic solar cells, in order to be able to utilize the electrically currents excited by the photovoltaic effect with low losses.

A mechanically stable layer is understood hereinafter to mean a layer which has resistance to stress by scratching, sharp-edged objects or materials, characterized, for example, by the pencil hardness according to DIN EN 13523-4: 2001.

Areal resistance is understood hereinafter to mean the ohmic resistance which is obtained on a coating with a uniform coating thickness when a square region of any size is contacted on two opposite edges and the current is measured as a function of the (direct-current) voltage. The areal resistance is measured in $\Omega$ and indicated by $\Omega/\square$. The areal resistance can also be determined by other methods, for example four-point measurement.

Specific resistance is understood hereinafter to mean the ohmic resistance which is obtained by multiplying the areal resistance by the layer thickness [in cm] and constitutes a measure of the ohmic properties of the conductive material itself. The specific resistance is reported in $\Omega \cdot cm$.

Transmission is understood hereinafter to mean the transmission of a transparent body for light of wavelength 550 nm. The transmission of a coated glass is reported in relation to the transmission of the same uncoated glass in percentages.

Hereinafter, transparent conductive substances are understood to mean compounds from which a transparent conductive film, abbreviated to "TCF", can be produced.

There has long been a search for a process which allows TCFs to be applied to glass or plastic surfaces in an inexpensive coating or printing process in order thus to be able to dispense with the technically complicated vacuum processes, for example sputtering, CVD or PVD, for the production of transparent conductive layers.

A series of patent applications describes the use of soluble metal compounds for the production of conductive transparent layers by means of coating or printing techniques. WO 98/49112 describes, in particular, the use of indium and tin compounds, and also antimony and tin compounds, which can be converted by pyrolysis or hydrolysis to indium tin oxide, hereinafter abbreviated to "ITO". The precursor compounds can be pyrolysed by heating in an oven to over 500° C. or by laser irradiation, described in WO 95/29501. The precursor compounds used are indium octanoate and tin octanoate (JP 54009792), formates (EP 192 009), chlorides (EP 148 608), acetylacetonates (JP 61009467), nitrates (JP 02126511) and also organometallic compounds such as dibutyltin dioctanoate (JP 02192616) and trimethyl- or triethylindium, and also tetramethyl- or tetraethyltin (JP 6175144). In JP 6175144, the precursor compounds are decomposed by means of UV radiation and converted to ITO.

With the technical approach of hydrolysis, frequently referred to as sol-gel coating, conductive transparent layers with thicknesses of 100 nm to 500 nm and areal resistances of 200 to $1500\Omega/\square$ have been obtained. An exception is formed by EP 0192009, in which a layer of ITO with an areal resistance between $7.5\Omega/\square$ and $35\Omega/\square$ with a layer thickness between 90 nm and 300 nm is described by flame pyrolysis of a mixture of indium formate and dibutyltin oxide. However, this process has the disadvantage of an unsatisfactorily low transmission of the layer, which is between 79% and 82%. The specific resistances of the layers from these processes are typically a few $10^{-3}$ $\Omega \cdot cm$ and can even be reduced down to $2 \cdot 10^{-4} \Omega \cdot cm$ for very thin layers, as can be discerned from EP 0192009. These layers thus already have a conductivity typical of sputtered ITO layers. Experiments have shown that a greater value of in some cases over 90% transmission with areal resistance below $100\Omega/\square$ is obtained when a plurality of layers are printed one on top of another. However, this is much more complicated from a technical point of view and is therefore too expensive for commercial applications.

An alternative approach to the construction of highly conductive transparent layers with an areal resistance below $1000\Omega/\square$ in a coating or printing process consists in the use, for example, of ITO or ATO (antimony tin oxide) nanoparticles whose mean sizes are below 100 nm and are therefore significantly smaller than the wavelengths of visible light. These nanoparticles afford layers of high transmission of at least 90%, measured at a light wavelength of 550 nm (JP 2001279137, U.S. Pat. No. 5,662,962).

Instead of spherical nanoparticles, it is also possible to use fine, needlelike particles, described in U.S. Pat. No. 6,511, 614. In the case of suitable production, the specific resistance within the particles is only a few $10^{-4} \Omega \cdot cm$. The macroscopic areal resistance depends upon the contact of the particles to one another, the so-called percolation, and the conductivity of the medium between the particles. Since an nonconductive organic binder which enables a certain unspecified mechanical stability of the layer is used in U.S. Pat. No. 6,511,614, the specific resistance at over $0.1\Omega \cdot cm$ is much too high to obtain highly conductive layers.

Particulate layers can be realized in layer thicknesses up to well over 1 μm. For this purpose, virtually all common coating and printing techniques are suitable, provided that the nanoparticles are well dispersed. The layers obtained by the process described in WO 03/004571 are, after the application and the evaporation of the solvent, consolidated by sintering processes. Energy required for this purpose is introduced by laser radiation or in a thermal manner. The layers obtained in this way are, however, highly porous. The porosity cannot be eliminated even by treatment at temperatures between 500° C. and 800° C. The specific resistance at $10^{-2} \Omega \cdot cm$ is therefore significantly above the values of the other abovementioned processes. An areal resistance below $100\Omega/\square$, which is desirable for highly conductive layers, therefore necessitates layer thicknesses above 1 μm. The use of such great layer thicknesses in modern displays is, however, technically disadvantageous and economically unviable. A further disadvantage of particulate layers is the low mechanical stability which, as a result of the sintering of the particles with one another and with the support material, is so weak that the layers can be wiped readily off the carrier. Binder is therefore additionally used. Binders in turn bring about the increase in the areal resistance.

There is one possibility of using conductive binders in order to increase both mechanical stability and electrical conductivity. In the simplest case, it is possible for this purpose to use conductive polymers. Since the common polymers are, however, p-conductive, while most of and the best conductive metal oxides are n-conductive, these materials are generally incompatible.

Another approach consists in using the TCOs ("transparent conductive oxides") as binders. One embodiment of the use of precipitated metal oxides as binders between metal oxide nanoparticles in a sol-gel approach is described by JP 05314820. The formulation disclosed in JP 05314820 consists of indium oxide and tin oxide nanoparticles, and also hydrolysable indium and tin salts, in a solvent. In this case, the portion by mass of the particles of 2 g is significantly smaller than that of the metal salts, of which 45 g are used. The formulation is applied to a substrate, dried and at the same time hydrolysed, and calcined at 500° C. The layer thicknesses thus achieved are less than 100 nm, and areal resistances of at least 430Ω/☐ are realized. These values are too high for applications in displays or photovoltaic components. Obviously, several layers have to be applied, dried and calcined in succession in order to bring about lower areal resistances. One variation to this approach is described in DE 19754664. In this approach, in a first working step, conductive transparent layers of metal oxide particles, for example ITO or ATO, are applied in a solvent which is dried. A sol-gel coating which comprises oxidation-resistant metal particles or salts thereof, which are intercalated into the TCO layer, is applied thereto. The resulting layer has a very good mechanical stability, pencil hardness 8H, but areal resistances over 1000Ω/☐.

An essential common feature to all processes for producing transparent conductive layers based on TCO is the thermal treatment of the layer or the sintering of the particles. It is only this step that leads to a continuous layer which is mechanically stable and has a high transparency and at the same time high electrical conductivity. The state of the art is the heating of the layer on the substrate in an oven. However, the thermal behaviour of the substrate also has to be taken into account in the heating. For example, thermal expansion, deformations and changes on the substrate surface during heating, or the formation of mechanical stresses which have to be kept within limits if the TCO layer is not to be affected adversely, necessitate time-consuming and hence costly control of the profile of temperature with time. For the same reasons, the temperature which can be established in the thermal treatment is limited. Some substrates, for example plastics, must not be heated to such a high degree as would be required to achieve optimal electrical conductivity and transparency of the TCO layer.

DE 199 40 458 A1 discloses a process for thermally modifying electrically at least semiconductive coating materials which are subjected to a high-frequency electromagnetic field. The thermal action of the electromagnetic field is based on convection currents induced in the material. The frequency of the electromagnetic field which is applied to the coating material to be modified thermally in one step is within the range from a few kilohertz up to a maximum of a few megahertz, preferably in the range from 100 to 500 kHz.

Current transparent ITO contacts for touchscreen applications, flat screens based on LCD or OLED modules or illumination modules based on OLEDs or ELs and for solar cells are structured by standard lithography steps. To this end, ITO (indium tin oxide) is typically deposited under reduced pressure (for example sputtering technique) over a large area on a substrate (for example glass). Thereafter, by means of illumination of an applied light-sensitive coating by masking and subsequent etching-away of the ITO, the desired structure is obtained.

One disadvantage is that a certain proportion of the material applied over a large area, as a result of the subsequent etching, necessarily cannot be utilized viably. In view of the demand for ITO and the rise in the price of indium, there is potential here for material saving and hence cost saving, and, to some extent, the lower the effective areal covering of the ITO on the substrate is, the greater this potential.

Alternatively, the desired ITO tracks can also be deposited by means of shadow-masking, but what is known as under-sputtering often occurs here as a result of scattering effects, which leads to indistinct edges and hence to imprecisely defined structure edges. The problem of material waste outlined above likewise occurs here.

If a change in the layout is required, new masks have to be made up in both cases, i.e. the structuring is always tied to the mask design. This is also accompanied by a restriction in the variability of the substrate size.

Further known deposition processes of ITO are: PVD, CVD, evaporation, spray pyrolysis, pulsed laser ablation, ion beam deposition, among others. In addition, processes based on wet-chemical processing are in development, although the layer resistance is only of minor significance. The sol-gel technique (see, for example, Aergerter et al., Journal of Sol-Gel Science and Technology 27, p. 81, 2003) is particularly highly established here.

The conductivity is generally scaled to the layer thickness of the contact. However, the absorption of light also rises with increasing layer thickness. Commercially available ITO conductor tracks have been optimized for both aspects. In the case of very good quality of a 100 nm-thick ITO layer, resistances of 20-50 ohm/square are achieved. The transparency is 90-95% in the visible range. The layers are usually deposited by means of a magnetron sputtering technique under elevated temperatures (>200° C.).

Transparent base contacts (e.g. ITO) which are applied by means of sputtering processes exhibit, in spite of their low roughness of about 1 nm RMS, typically local height differences (spikes) of several nanometres (>10 nm). The reasons for this under some circumstances lie in the order of magnitude of the thickness of the organic layers. In such cases, the probability of short circuits, local current density peaks and elevated leakage currents rises, which usually results in a short lifetime of the OLED component. If necessary, the ITO contact is subsequently subjected to a polishing step, which is, however, time-consuming and costly.

It was an object of the present invention to find novel transparent, electrically conductive layers. An important aspect is the simple and material-saving incorporation of the production of such a layer into the industrial manufacturing process, especially of light-emitting components and displays.

Such a layer should, as well as ensuring the physical properties of the contact, in particular good conductivity and high transparency and low roughness and low probability of short circuits, satisfy the following points in particular:

Optimal material yield, very few process steps and avoidance of complicated processing under reduced pressure in the production, avoidance of structuring masks, variability in the layout and design of the structures, variability of the substrate size and simple scalability for large areas.

SUMMARY OF THE INVENTION

It has been found that, surprisingly, transparent, electrically conductive layers which satisfy the requirements stated above are obtained when the compounds of the formula 1 described below are used.

The present invention provides a transparent, electrically conductive layer, characterized in that
the layer is based on at least one compound of the general formula 1

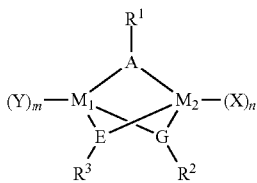

and the substituents are each defined as follows:

$M_1$, $M_2$: identical or different metals in the 0 to 4 oxidation states;

A, E, G: identical or different metals or nonmetals,

X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$, n, m: identical or different numbers in the range of 0-4.

The present invention further provides a transparent, electrically conductive layer, obtainable by A) applying compounds of the formula 1 from a solution to a substrate

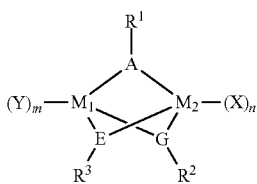

where the substituents are each defined as follows:

$M_1$, $M_2$: identical or different metals in the 0 to 4 oxidation states;

A, E, G: identical or different metals or nonmetals,

X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$, n, m: identical or different numbers in the range of 0-4.

B) removing solvents and additives by energy input,

C) aftertreating the layer by energy input.

DETAILED DESCRIPTION OF THE INVENTION

In the invention described here, it is essential that the layer is applied to the substrate from a liquid composition, i.e. a solution. Solutions of compounds of the general formula (1) are applied on the substrate in a structured or unstructured coating process and then aftertreated.

The metals $M_1$ and $M_2$ may bear the 0 to 4 oxidation states. Preferred oxidation states are 1, 2 and/or 3. Generally suitable are alkali metals, alkaline earth metals, groups 13 and 14, transition metals, Sb, Bi. The metals $M_1$ and $M_2$ are preferably metals of groups 13 and 14. The metals $M_1$ and $M_2$ are preferably indium and/or tin. The metals $M_1$ and $M_2$ may be present as cations. The metals $M_1$ and $M_2$ may be complexed by means of further complexing agents.

In general, X, Y, $R^1$, $R^2$, $R^3$ are identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded to $M_1$ and/or $M_2$ via heteroatoms or functional groups.

The substituents A, E and G are preferably nonmetals; preferred substituents A, E and G are sulphur, nitrogen, phosphorus and/or oxygen.

The X and Y groups may be further metals, preferably main group metals such as indium, tin, zinc, aluminium, antimony and arsenic or alkali metals, alkaline earth metals, groups 13 and 14, transition metals or nonmetals such as carbon, nitrogen, phosphorus and oxygen.

$R^1$, $R^2$ and $R^3$ are preferably hydrocarbon radicals and may be the same or different. They consist of carbon-containing groups. These carbon-containing groups may be alkyl or aryl groups. They may be oligomers or polymers. The alkyl groups may be a divalent branched or unbranched, saturated or unsaturated hydrocarbon having 1 to 200 carbon atoms. The aryl group may be a substituted or unsubstituted phenyl or naphthyl group. In addition they may have heteroatoms and/or functional groups.

The substituents X, Y, $R^1$, $R^2$ and $R^3$ may bear donor or acceptor substituents. Acceptor substituents may be —COOR$^4$, —CO—R$^4$, —CN, —SO2R$^4$, —SO2OR$^4$, —CO—V—CO— where $R^4$=H, —NH—R$^5$, alkyl, aryl or functionalized alkyl or aryl, V=O or N—R$^5$, $R^5$=alkyl, Z-functionalized alkyl, polymers, cyclic organic groups, aryl or Z-functionalized aryl of the form Ar—Zn (n=1-5), Z=—OH, —SH, —SO$_3$H, —SO$_3$M, —B(OH)$_2$, —O(CH$_2$—CH$_2$—O)$_n$H, —COOH, —NH$_2$, —N(R$^6$)$_2$, —N((CH$_2$—CH$_2$—O)$_n$H)$_2$, CON((CH$_2$—CH$_2$—O)$_n$H)$_2$, trialkoxysilyl, perfluoroalkyl, $R^6$, —NH$_3^+$, —N(R$^6$)$_3^+$, —SO$_2$—N(R$^6$)$_2$, —NO$_2$, —Cl, —CO—N(R$^6$)$_2$, —SS— or —SCN, M=metal, for example alkali metal ions or alkaline earth metal ions, or N(R$^6$)$_4^+$ where $R^6$=H. Alkyl or aryl donor substituents may be alkyl, aryl or functionalized alkyl or aryl.

In particular substitution patterns, isomers, especially stereoisomers, may occur. These are likewise suitable in accordance with the invention.

Preferred compounds of the formula 1 are those with the following substituents:

$M_1$: alkali metals, alkaline earth metals, groups 13 and 14, transition metals, Sb, Bi [when $M_2$=Sn], $M_2$: alkali metals, alkaline earth metals, groups 13 and 14, transition metals, Sb, Bi [when $M_1$=Sn],

A: O, S, N, P,

E: O, S, N, P,

G: O, S, N, P,

X: alkali metals, alkaline earth metals, groups 13 and 14, transition metals, Sb, Bi, Y: alkali metals, alkaline earth metals, groups 13 and 14, transition metals, Sb, Bi, $R^1$: identical or different branched or unbranched, saturated or unsaturated hydrocarbon radicals, $R^2$: identical or different branched or unbranched, saturated or unsaturated hydrocarbon radicals, $R^3$: identical or different branched or unbranched, saturated or unsaturated hydrocarbon radicals.

Particularly preferred compounds of the formula 1 are those with the following substituents:

$M_1$: In, $M_2$: Sn,

A: O, S, N,

E: O, S, N,

G: O, S, N,

X: alkali metals, alkaline earth metals, groups 13 and 14, transition metals, Sb, Bi,
Y: alkali metals, alkaline earth metals, groups 13 and 14, transition metals, Sb, Bi,
R$^1$: methyl, ethyl, propyl, i-propyl, i-amyl, tert-butyl,
R$^2$: methyl, ethyl, propyl, i-propyl, i-amyl, tert-butyl,
R$^3$: methyl, ethyl, propyl, i-propyl, i-amyl, tert-butyl.

Very particular preference is given to the following compounds:

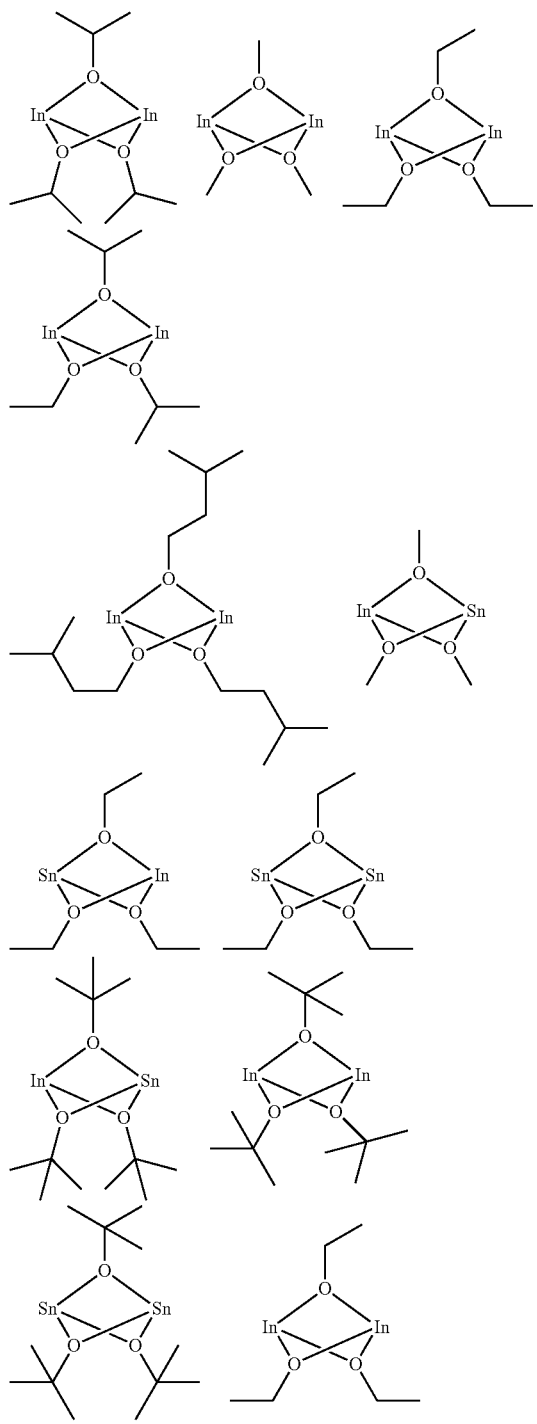

Very particular preference is given to In(O$^t$Bu)$_3$Sn and tri(tert-butoxy)indium stannite.

It is advantageous in this invention in particular that the transparent conductive layer is applied exclusively to the desired sites and hence only the amounts of material actually needed are required. In the case of use of a structuring coating process, for example inkjet printing, the addressing of the printer head offers the possibility of precisely adjusting the TCF electrode layout in form and layer thickness. With regard to the variability too, the designs can correspondingly be modified rapidly by means of suitable software solutions. The original restriction resulting from masks is eliminated entirely.

A further advantage of the inventive layers is that this production can take place under standard pressure and at room temperature—preferably in a cleanroom for low particle contamination. This is also accompanied by the simple scalability of manufacturing up to large substrates with the inventive compounds when the processing does not have to take place in vacuum units. The substrates may be processed in any formats and forms.

The incorporation into a continuous roll-to-roll process is also simpler than in the case of use of stepwise masking.

The inventive solution may comprise additives. These additives may, for example, optimize the drying behaviour, the stability, the flow properties (wetting), the printing properties (resolution, line width, gap width), the surface homogeneity, the rheology, the transparency, the conductivity, the surface tension, the droplet formation (inkjet), the adhesion on the substrate and on printer rolls (flexographic printing, screenprinting) and the speed. They may be monomers, oligomers or polymers.

The combination of printing process and aftertreatment (drying/sintering, if appropriate forming) leads to good conductivity and transparency values. As a result of the presence of individual molecules in the solution, especially with tin and indium in one molecule, there is optimal distribution of the two metals. This is crucial for a high conductivity. Owing to the lack of particle interfaces as in the case of nanoscale materials, light scattering is prevented and a high transparency is obtained.

Owing to the inventive solution of the compounds of the formula 1 from a liquid composition of dissolved molecules, it would be expected that the layers have a homogeneous surface roughness and the number of local excess heights is lowered drastically. This would be very desirable for a better yield, fewer short circuits and a longer lifetime of the devices.

Owing to the molecular compounds used, the roughness of the TCF regions applied by printing will be in the range (approx. 2 nm RMS, peak-valley value) of sputtered contacts (approx. 1 nm RMS). The value will be below the measured values of nanoparticulate layers.

It is possible with the inventive compounds to produce layers with a specific resistance of at most 100Ω·cm. It is particularly advantageously possible with the inventive compounds to achieve high layer thicknesses above 500 nm with specific resistances below 1Ω·cm, preferably layer thicknesses above 800 nm with specific resistances below 0.5Ω·cm, with simultaneously good mechanical stability, which are better suited to robust applications than layers obtained according to the prior art. What is likewise advantageous about the layer obtained in accordance with the invention is that it has a transmission of at least 50%.

The invention also provides a process for producing a transparent, electrically conductive layer, characterized in that
the layer is produced on the basis of at least one compound of the general formula 1

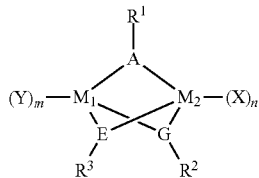

and the substituents are each defined as follows:
$M_1$, $M_2$: identical or different metals in the 0 to 4 oxidation states;
A, E, G: identical or different metals or nonmetals,
X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$,
n, m: identical or different numbers in the range of 0-4.

The invention also provides a process for producing a transparent, electrically conductive layer, which has at least three process steps:
A) applying a solution of at least one compound of the formula 1 to a substrate from a liquid formulation or via the gas phase

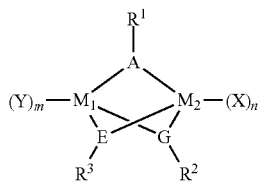

where the substituents are each as defined above,
B) removing solvents and additives by energy input,
C) aftertreating the layer by energy input.

The present invention will be described in detail hereinafter without any intention that the invention, whose scope of protection is evident from the claims and the description, be restricted to these embodiments.

According to the invention, the solvent used may be at least one organic, protic, aprotic, polar or nonpolar solvent, or an inorganic liquid. In the process according to the invention, the solvent used with preference may be an acid, a glycol, $C_1$- to $C_8$-hydrocarbons, aromatic hydrocarbons, aliphatic hydrocarbons, aromatically or aliphatically halogenated hydrocarbons, S-, P- or Si-heterosubstituted hydrocarbons, or supercritical solvents, or silicones, or organic compounds selected from mono-, oligo-, polymers, dyes, conductive organic compounds, nonoxidic inorganic compounds, organometallic compounds, organic compounds which form reactive intermediates and are selected from benzoyl peroxide, azobisisobutyronitrile, or a mixture of these organic compounds, or a mixture of these compounds.

The composition is preferably applied to a solid substrate which comprises or is glass, quartz glass, metal, stone, wood, concrete, paper, textiles or plastic. The plastic used may be, for example, polyester, polyamide, polyimide, polyacrylate, polycarbonate (PC), polyether sulphone (PES), polyether ether ketone (PEEK), polyvinyl chloride (PVC), polyethylene (PE), polypropylene (PP), polyacetal (POM) or a mixture of these polymers.

The polyester used may be polyethylene terephthalate (PET), polyethylene naphthalate (PEN), polybutylene terephthalate (PBT), polyhydroxybutyrate (PHB) or a mixture of these polyesters. The polyamide used may be polyamide 6, polyamide 6.6, polyamide 11, polyamide 12 or a mixture of these polyamides. The polyimide used may be Kapton®. The polyacrylate used may preferably be polymethyl methacrylate (PMMA).

According to the invention, the composition of the formula 1 can be applied by flexographic printing, inkjet printing, offset printing, screenprinting, spraying, pad printing, thermal transfer printing, laser printing, spin-coating, dipping, flow-coating, knife-coating or casting.

After the application A), the solvent and any additives are removed by energy input in step B). This can be effected by heating via contact, thermal radiation, laser radiation, UV radiation, microwave radiation, electron radiation, X-radiation, light radiation, flashlamp radiation, by mechanical energy and by vibration energy, for example ultrasound.

The layers C) can be aftertreated by heating via contact, thermal radiation, laser radiation, UV radiation, microwave radiation, electron radiation, X-radiation, light radiation, flashlamp radiation, by mechanical energy and by vibration energy, for example ultrasound. It may be advantageous to flow gases over the layer, preferably reducing gases, more preferably hydrogenous gases.

It may be advantageous when the composition is applied to the substrate in the form of several layers in succession. It is possible with preference to apply to the substrate a plurality of layers which have identical or different compositions. It may also be advantageous when the layer applied is dried between step A) and B). Preference is given to drying the layer applied until the weight of the substrate with the layer or layers applied no longer changes. The layer applied can preferably be dried in an oven. More preferably, the layer applied can be dried by flowing heated gas or heated air over it.

Moreover, the layer can preferably be flowed over by an oxidizing gas during part of the duration of the aftertreatment, for example by air, in order to remove organic constituents from the layer. Moreover, the layer can preferably be flowed over during a remaining part of the duration of the aftertreatment by a reducing gas, for example by forming gas. Part of the duration of the aftertreatment is understood to mean a time interval which begins with the beginning of the aftertreatment and whose length may preferably be selected from 10%, 20%, 30%, 40%, 50%, 60%, 70%, 80% or 90% of the duration of the aftertreatment. A remaining part of the duration of the aftertreatment is understood to mean a time interval which ends with the end of the aftertreatment and can be selected from 90%, 80%, 70%, 60%, 50%, 40%, 30%, 20% or 10% of the duration of the aftertreatment.

During the aftertreatment, the thickness of the composition applied decreases. The layer thickness obtained after the procedure is referred hereinafter as dry layer thickness. The layer obtained in accordance with the invention preferably has a dry layer thickness of 10 nm, to 100 µm, further preferably of 200 nm to 15 µm, more preferably of 500 nm to 5 µm.

The layer obtained in accordance with the invention preferably has an areal resistance of 10Ω/□ to 100Ω/□. Moreover, the layer obtained by the process according to the invention preferably has a transmission of >50%, more preferably of >60% to 99%, most preferably of >80%.

The inventive layer or the layer produced in accordance with the invention is particularly suitable for use in electronic components. The invention therefore likewise provides an electronic component which has an inventive layer or layer produced in accordance with the invention. Such components can advantageously be used in a display, photovoltaic element, touch-sensitive screen, resistance heating element, infrared protection film, antistatic casing, chemical sensor, electromagnetic sensor, an illumination element, for example an OLED (organic light-emitting diode) or EL (electroluminescent lamp).

The invention will be illustrated in detail hereinafter.

The transparent conductive layer has to satisfy the corresponding requirements on, for example, conductivity and transparency.

For this purpose, it is necessary to dissolve the suitable compound of the general formula 1 in a suitable solvent, which, though, must also be compatible with a coating process. The inventive layer can be produced by structured or unstructured coating processes.

Examples of printing processes include offset printing, thermal transfer printing, laser printing, flexographic printing, screenprinting, pad printing and inkjet printing. Examples of unstructured coating processes include knife-coating, spraying, flow-coating, casting, dipping and spin-coating. This is followed by an aftertreatment (energy input), for example a drying or sintering process. This can proceed, for example for ITO, under atmosphere or protective gas, for example nitrogen or argon, at 100° C. to 300° C. for 10 min to 5 h. Subsequently, if desired, the surface oxygen content is reduced (forming). The process proceeds under pure hydrogen or a mixture of hydrogen and protective gas (e.g. nitrogen or argon, hydrogen content 99%-0.5%) at a gas flow of static up to 1000 l/h for 10 min to 4 h. Inventive layers are obtained with homogeneous thickness, uniform surface, high conductivity and high transparency.

The liquid composition is preferably applied by an inkjet process with, for example, hydrocarbons such as toluene, if desired together with humectant and further additives.

In screening tests, the proportion of the compound of the general formula 1, of the humectant and of further additives was varied systematically in order thus to optimize the composition for the particular coating process. Crucial factors for this are the viscosity and rheology and the surface tension. Homogeneous layers were obtained with good surface properties, low roughness and simultaneously high transparency and conductivity.

An important aspect during the optimization of the desired properties is the thermal aftertreatment of the coated TCO surfaces.

Optimized heating and cooling times allowed crack formation in the layer and other defects to be prevented and the conductivity to be simultaneously maximized.

Furthermore, the layers now present do not have excessively great roughness such that other layers of the electronic components which are deposited thereon are not short-circuited or unstable. Values in the range of 2 nm RMS were measured on the layers, which is within the typical range for sputtered ITO.

EXAMPLES

General Techniques

All syntheses involving organometallic compounds were effected, owing to their high air and moisture sensitivity, in a protective gas atmosphere composed of nitrogen which was available through evaporation of liquid nitrogen (Messer Griesheim). All reactions were effected with the aid of standard Schlenk techniques or in a glovebox.

Before utilization under reduced pressure, the glass apparatus used was baked out with a naked flame and, after cooling, filled with nitrogen and evacuated three times. Only after this operation was the filling of chemicals commenced. Liquid substances were transferred by means of syringes and cannula which were stored in a drying cabinet and flushed repeatedly with nitrogen before use.

In the syntheses, only anhydrous chemicals were used. The solvents used were dried by standard methods: tetrahydrofuran, diethyl ether, toluene, n-pentane and n-hexane were absoluted with sodium and benzophenone in the protective atmosphere with reflux cooling and freshly distilled before use. The violet colour of the dissolved sodium benzophenone ketyl shows the absolute freedom of the solvent from water and oxygen. Tetraethylene glycol dimethyl ether (0.5% by volume) was added to the nonpolar hydrocarbons to improve the solubility of the benzophenone disodium.

Preparation of tri(tert-butoxy)indium stannite, $In(O^tBu)_3Sn$ (ITBO)

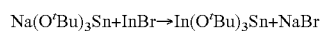

In a 100 ml one-neck Schlenk flask, 2.92 g (15 mmol) of In(I)Br in 75 ml of toluene are mixed with TMEDA (5 mol %) and stirred at room temperature for half an hour. 3.61 g (10 mmol) of $Na(O^tBu)_3Sn$ in 10 ml of toluene are slowly added dropwise to this mixture with vigorous stirring. After stirring at 100° C. for 48 h, the solution is removed by filtration from the insoluble residue, which may still comprise a little indium. After concentration of the solvent, the residue is dried under reduced pressure. The product obtained is a yellowish-white solid. The product can be obtained in very pure form by recrystallization from pentanes or sublimation at 30° C./$10^{-2}$ mbar.

$^1$H-NMR ($C_6D_6$): δ1.35 ppm (singlet)

Preparation of tri(tert-butoxy)sodium stannite, $Na(O^tBu)_3Sn$ 5.30 g (0.02 mol) of tin di-tert-butoxide in 20 ml of diethyl ether are added slowly to a suspension of sodium tert-butoxide (0.02 mol in 20 ml of diethyl ether). After the components have been combined, heating occurs, in the course of which all constituents go into solution. The products are purified by means of recrystallization from diethyl ether or else by sublimation. After completion of the reaction, the solvent is removed under reduced pressure and the product is obtained as white powder.

Yield: 7.22 g (~100%)
$^1$H-NMR ($C_6D_6$): δ0.40 ppm (singlet)

Preparation of di(tert-butoxy) stannite, $Sn(O^tBu)_2$ 2.5 ml (26 mmol) of tert-butyl alcohol are slowly added dropwise to 10 g (26 mmol) of bis[bis(trimethylsilyl)amino]tin(II) in 50 ml of pentane. The initially yellow colour of the solution disappears spontaneously. The reaction mixture is subsequently stirred at room temperature for 2 hours. After completion of the reaction, the solvent is removed under reduced pressure and the product is obtained as white powder.

Yield: 6.89 g (~400%)
Melting point: 73-75° C.; $^1$H-NMR ($C_6D_6$): δ1.43 ppm (singlet)

Coatings with ITBO

Under a protective gas atmosphere, solutions of ITBO in 2-isopropoxyethanol and toluene were prepared and prepared as a thin layer by spin-coating. In order to be able to obtain very detailed information regarding the influence of the compound on the conductivity, three different substrates were used in the experiments:

ITO on glass (dried at 80° C.)

ITO on glass (dried at 400° C.)

uncoated glass

After the coating of the substrates by spin-coating, the thin layers prepared were dried at temperatures of 200, 450 and 625° C. in air and then formed, i.e. treated with $N_2/H_2$ (90/10).

TABLE 1

Sample designation and the essential preparation parameters

| Example | Coating system | Solvent | Drying temperature (° C.) |
|---|---|---|---|
| 1 | ITO(400° C.) + ITBO | ITBO in 2-isopropoxy-ethanol | 200 |
| 2 | ITO(400° C.) + ITBO | ITBO in 2-isopropoxy-ethanol | 450 |
| 3 | ITO(400° C.) + ITBO | ITBO in 2-isopropoxy-ethanol | 625 |
| 4 | ITBO | ITBO in toluene | 200 |
| 5 | ITO(80° C.) + ITBO | ITBO in toluene | 450 |
| 6 | ITO(80° C.) + ITBO | ITBO in toluene | 625 |
| 7 | ITO(400° C.) + ITBO | ITBO in toluene | 625 |

Table 1 lists sample designation and the essential preparation parameters (substrate, coating system, drying temperature). Hereinafter, only the sample designation is cited. After the forming phase, 2-point and 4-point resistance measurements at various sites on the thin layers prepared were performed, of which only the mean values are reported in Table 2. After the forming phase, 2-point and 4-point resistance measurements were performed at various sites on the thin layers prepared, which are reported as mean values in Table 2.

As a reference in the conductivity measurements, ITO layers without ITBO were used. In the first resistance measurements, it was found that ITBO can bring about a great improvement in the conductivity of the ITO layers: compared to the ITO layers, a conductivity higher by two- to three-fold is observed. Furthermore, the sample coated only with ITBO (Example 4) was found to be outstandingly conductive.

TABLE 2

Average resistance values of selected samples

| Example | Coating system | 4-Point resistance |
|---|---|---|
| Comparative | ITO(400° C.) | 41.60 Ω/□ |
| 1 | ITO(400° C.) + ITBO | 21.48 Ω/□ |
| 2 | ITO(400° C.) + ITBO | 20.60 Ω/□ |
| 3 | ITO(400° C.) + ITBO | 24.50 Ω/□ |
| 4 | ITBO | 20.15 Ω/□ |
| 5 | ITO(80° C.) + ITBO | — |
| 6 | ITO(80° C.) + ITBO | 20.78 Ω/□ |
| 7 | ITO(400° C.) + ITBO | — |

Optimization of the Coating Parameters

Solvent

ITBO is very soluble and stable in solvents such as toluene, tetrahydrofuran and pentane. In contrast, the solutions are unstable in protic solvents such as 2-isopropoxyethanol: these solvents react with ITBO slowly with decomposition. After a comparison of the conductivities, it was found that inert solvents such as toluene are better suited to the preparation of thin ITBO layers than reactive solvents such as 2-isopropoxyethanol.

The disclosure in DE 102007013181.1, filed Mar. 20, 2007, is hereby incorporated by reference.

The invention claimed is:

1. An amorphous transparent, electrically conductive layer comprising at least one compound of the formula 1

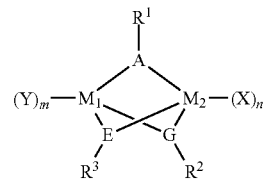

wherein the substituents are each defined as follows:
$M_1$, $M_2$: identical or different metals in the 0 to 4 oxidation states;
A, E, G: identical or different metals or nonmetals,
X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$
n, m: identical or different numbers in the range of 0-4.

2. A transparent, electrically conductive layer according to claim 1, wherein $M_1$ and $M_2$ are selected from the group consisting of an alkali metal, an alkaline earth metal, a group 13 element, a group 14 element, a transition metal, Sb, and Bi.

3. A transparent, electrically conductive layer according to claim 1, wherein at least one of A, E and G is sulphur, nitrogen, phosphorus or oxygen.

4. A transparent, electrically conductive layer according to claim 1, wherein X and Y are selected from the group consisting of an alkali metal, an alkaline earth metal, a group 13 element, a group 14 element, a transition metal, Sb, Bi, which may also be substituted by organic and/or functional groups.

5. A transparent, electrically conductive layer according to claim 1, wherein X and Y are at least one selected from the group consisting of indium, tin, zinc, aluminum, antimony, arsenic, an alkali metal, an alkaline earth metal, a group 13 element, a group 14 element, a transition metal, carbon, nitrogen, phosphorus and oxygen.

6. A transparent, electrically conductive layer according to claim 1, wherein $R^1$, $R^2$ and $R^3$ are each hydrocarbon radicals having 1 to 200 carbon atoms, hydrocarbons, oligomeric or polymeric hydrocarbons.

7. A transparent, electrically conductive layer according to claim 1, wherein at least one of X, Y, $R^1$, $R^2$, and $R^3$ contains a donor group and/or an acceptor group.

8. A transparent, electrically conductive layer according to claim 1, wherein the compounds of the formula 1 have the following substituents:

$M_1$ an alkali metal, an alkaline earth metal, a group 13 element, a group 14 element, a transition metal, Sb, or Bi when $M_2$ is Sn, $M_2$: an alkali metal, an alkaline earth metal, a group 13 element, a group 14 element, a transition metal, Sb, or Bi when $M_1$ is Sn, A: O, S, N, or P, E: O, S, N, or P, G: O, S, N, or P, X: an alkali metal, an alkaline earth metal, a group 13 element, a group 14 element, a transition metal, Sb, or Bi Y: an alkali metal, an alkaline earth metal, a group 13 element, a group 14 element, a transition metal, Sb, or Bi $R^1$: identical or different branched or unbranched, saturated or unsaturated hydrocarbon radicals, $R^2$: identical or different branched or unbranched, saturated or unsaturated hydrocarbon radicals, $R^3$: identical or different branched or unbranched, saturated or unsaturated hydrocarbon radicals.

9. A transparent, electrically conductive layer according to claim 1, wherein the compounds of the formula 1 have the following substituents:

$M_1$: In, $M_2$: Sn,

A: O, S, or N,

E: O, S, or N,

G: O, S, or N,

X: an alkali metal, an alkaline earth metal, a group 13 element, a group 14 element, a transition metal, Sb, or Bi Y: an alkali metal, an alkaline earth metal, a group 13 element, a group 14 element, a transition metal, Sb, or Bi $R^1$: methyl, ethyl, propyl, i-propyl, i-amyl, or tert-butyl, $R^2$: methyl, ethyl, propyl, i-propyl, i-aryl, or tert-butyl, $R^3$: methyl, ethyl, propyl, i-propyl, i-amyl, or tert-butyl.

10. A transparent, electrically conductive layer according to claim 1, wherein the formula 1 represents at least one of the following compounds:

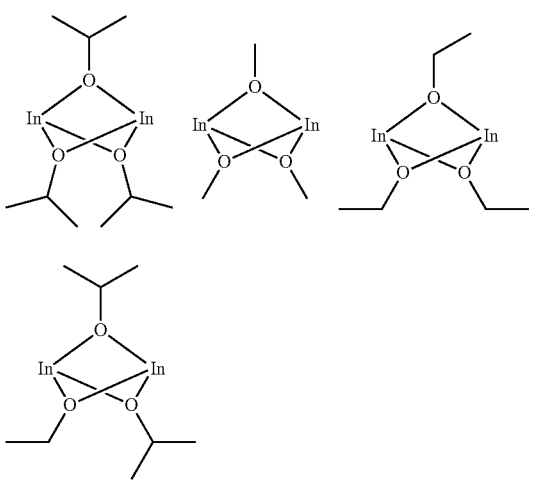

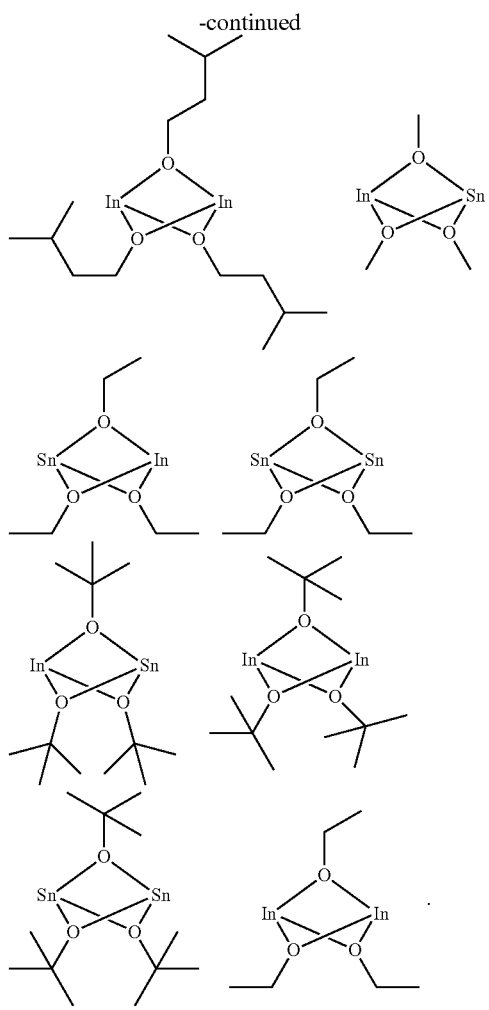

11. A transparent, electrically conductive layer according to claim 1, wherein the compound of formula 1 is tri(tert-butoxy)indium stannite $(In(O^tBu)_3Sn)$.

12. A product comprising a solid substrate having applied thereon the transparent, electrically conductive layer according to claim 1, wherein the solid substrate comprises a glass, a quartz glass, a metal, a stone, a wood, a concrete, a paper, a textile or a plastic.

13. A transparent, electrically conductive layer according claim 1, wherein the layer has a dry layer thickness of 10 nm to 100 μm.

14. A transparent, electrically conductive layer according to claim 1, wherein the layer has a specific resistance of at most 100Ω·cm.

15. A transparent, electrically conductive layer according to claim 1, wherein the layer has a transmission of at least 50%.

16. An electronic component having a layer according to claim 1.

17. The amorphous transparent, electrically conductive layer of claim 1, wherein $M_1$ and $M_2$ are in the same oxidation state.

18. The amorphous transparent, electrically conductive layer of claim 1, wherein $M_1$ and $M_2$ are the same.

19. The amorphous transparent, electrically conductive layer according to claim 1, wherein $M_1$ and $M_2$ are independently selected from the group consisting of a group 13 element and a group 14 element.

20. The amorphous transparent, electrically conductive layer according to claim 1, wherein $M_1$ and $M_2$ are selected from the group consisting of Al, Ga, In, Tl, Si, Ge, Sn and Pb.

21. The amorphous transparent, electrically conductive layer of claim 1, wherein the layer consists of one or more compounds of formula 1.

22. A product according to claim 12, wherein the substrate is cooled.

23. A product according to claim 12, wherein the solid substrate comprises plastic, which is a polyester, a polyamide, a polyamide, a polyacrylate, a polycarbonate (PC), a polyether sulphone (PES), a polyether ether ketone (PEEK), a polyvinyl chloride (PVC), a polyethylene (PE), a polypropylene (PP), a polyacetal (POM) or a mixture of these polymers.

24. A product according to claim 12, wherein the compound of the formula 1 is applied by flexographic printing, inkjet printing, offset printing, screenprinting, spraying, pad printing, thermal transfer printing, laser printing, spin-coating, dipping, flow-coating, knife-coating or casting.

25. A product according to claim 12, wherein the compound of the formula 1 is applied to the substrate in the form of a plurality of layers in succession.

26. A product according to claim 12, wherein a plurality of layers which have identical or different compositions are applied successively to the substrate.

27. A product according to claim 23, wherein the plastic is polyester, which is a polyethylene terephthalate (PET), a polyethylene naphthalate (PEN), a polybutylene terephthalate (PBT), a polyhydroxybutyrate (PHB) or a mixture of these polyesters.

28. A product according to claim 23, wherein the plastic is polyamide, which is a polyamide 6, a polyamide 6.6, a polyamide 11, a polyamide 12 or a mixture of these polyamides.

29. A product according to claim 23, wherein the plastic is polyacrylate, which is a polymethyl methacrylate (PMMA).

30. A product according to claim 28, wherein the composition is consolidated after each application.

31. An article comprising the electronic component according to claim 16, which article is a display, illumination module, photovoltaic element, touch-sensitive screen, resistance heating element, infrared protective film, antistatic casing, chemical sensor, or electromagnetic sensor.

32. An amorphous transparent, electrically conductive layer, obtained by
A) applying a solution comprising at least one compound of the formula 1 and, optionally, one or more solvents or carriers, from a liquid solution or from the gas phase to a substrate to form a layer

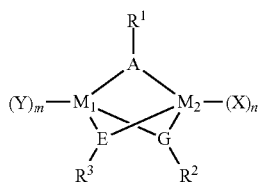

wherein the substituents are each defined as follows:
$M_1$, $M_2$: identical or different metals in the 0 to 4 oxidation states;
A, E, G: identical or different metals or nonmetals,
X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$,
n, m: identical or different numbers in the range of 0-4,
B) optionally, removing the solvent by energy input, then
C) aftertreating the layer by energy input.

33. A transparent, electrically conductive layer according to claim 32, wherein $M_1$ and $M_2$ is at least one selected from the group consisting of an alkali metal, an alkaline earth metal, a group 13 element, a group 14 element, a transition metal, Sb and Bi.

34. A transparent, electrically conductive layer according to claim 32, wherein A, E and G is at least one selected from the group consisting of sulphur, nitrogen, phosphorus or oxygen.

35. A transparent, electrically conductive layer according to claim 32, wherein X and Y is at least one selected from the group consisting of an alkali metal, an alkaline earth metal, a group 13 element, a group 14 element, a transition metal, Sb, and Bi, which may also be substituted by organic and/or functional groups.

36. A transparent, electrically conductive layer according to claim 32, wherein X and Y is at least one selected from the group consisting of indium, tin, zinc, aluminum, antimony, arsenic, an alkali metal, an alkaline earth metal, a group 13 element, a group 14 element, a transition metal, carbon, nitrogen, phosphorus or oxygen.

37. A transparent, electrically conductive layer according to claim 32, wherein $R^1$, $R^2$ and $R^3$ are each hydrocarbon radicals having 1 to 200 carbon atoms, oligomeric hydrocarbons, or polymeric hydrocarbons.

38. A transparent, electrically conductive layer according to claim 32, wherein at least one of X, Y, $R^1$, $R^2$, $R^3$ contains donor groups and/or acceptor groups.

39. A transparent, electrically conductive layer according to claim 32, wherein the compounds of the formula 1 have the following substituents:
$M_1$: an alkali metal, an alkaline earth metal, a group 13 element, a group 14 element, a transition metal, Sb, or Bi when $M_2$ is Sn,
$M_2$: an alkali metal, an alkaline earth metal, a group 13 element, a group 14 element, a transition metal, Sb, or Bi when $M_1$ is Sn,
A: O, S, N, or P,
E: O, S, N, or P,
G: O, S, N, or P,
X: an alkali metal, an alkaline earth metal, a group 13 element, a group 14 element, a transition metal, Sb, or Bi
Y: an alkali metal, an alkaline earth metal, a group 13 element, a group 14 element, a transition metal, Sb, or Bi
$R^1$: identical or different branched or unbranched, saturated or unsaturated hydrocarbon radicals,
$R^2$: identical or different branched or unbranched, saturated or unsaturated hydrocarbon radicals,
$R^3$: identical or different branched or unbranched, saturated or unsaturated hydrocarbon radicals.

40. A transparent, electrically conductive layer according to claim 32, wherein the compounds of the formula 1 have the following substituents:
$M_1$: In,
$M_2$: Sn,
A: O, S, or N,
E: O, S, or N,
G: O, S, or N,
X: an alkali metal, an alkaline earth metal, a group 13 element, a group 14 element, a transition metal, Sb, or Bi Y: an alkali metal, an alkaline earth metal, a group 13 element, a group 14 element, a transition metal, Sb, or Bi $R^1$: methyl, ethyl, propyl, i-propyl, i-amyl, or tert-butyl, $R^2$: methyl, ethyl, propyl, i-propyl, i-amyl, or tert-butyl, $R^3$: methyl, ethyl, propyl, i-propyl, i-amyl, or tert-butyl.

41. A transparent, electrically conductive layer according to claim 32, wherein the formula 1 represents at least one of the following compounds:

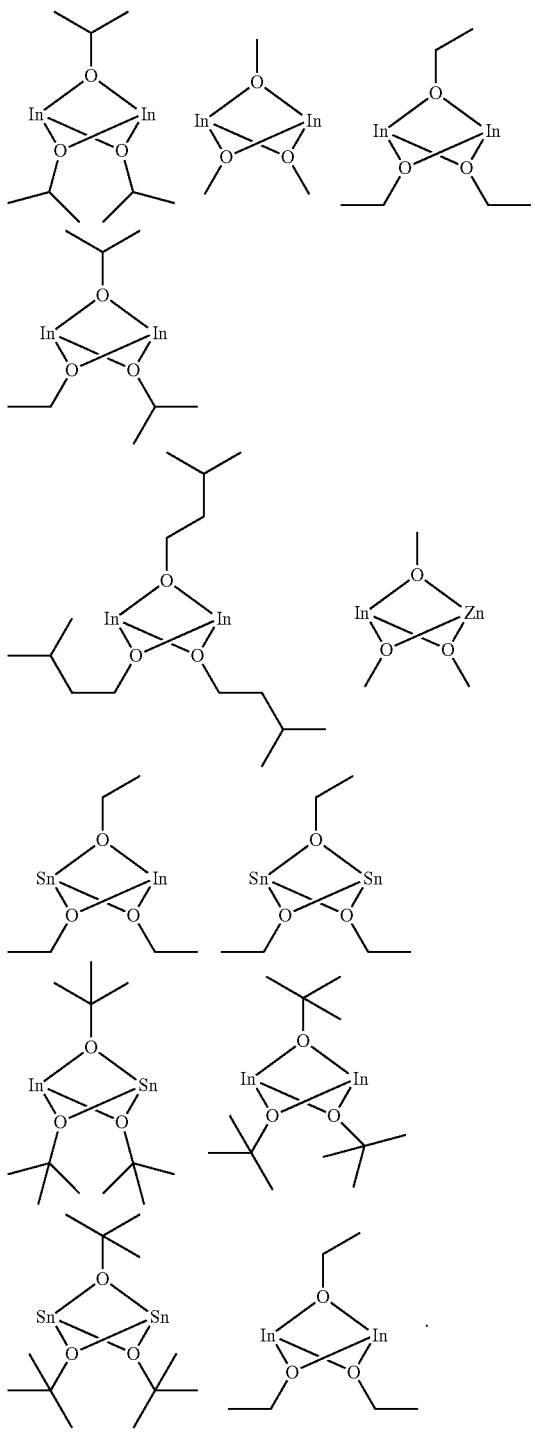

42. A product comprising a solid substrate having applied thereon the transparent, electrically conductive layer according to claim 32.

43. A transparent, electrically conductive layer according to claim 32, wherein the layer is flowed over by a gas at least during part of the duration of the aftertreatment C).

44. A transparent, electrically conductive layer according claim 32, wherein the layer has a dry layer thickness of 10 nm to 100 µm.

45. A transparent, electrically conductive layer according to claim 32, wherein the layer has a specific resistance of at most 100Ω·cm.

46. A transparent, electrically conductive layer according to claim 32, wherein the layer has a transmission of at least 50%.

47. An electronic component having a layer according to claim 32.

48. The amorphous transparent, electrically conductive layer of claim 32, wherein $M_1$ and $M_2$ are in the same oxidation state.

49. The amorphous transparent, electrically conductive layer of claim 32, wherein $M_1$ and $M_2$ are the same.

50. The amorphous transparent, electrically conductive layer according to claim 32, wherein $M_1$ and $M_2$ are independently selected from the group consisting of a group 13 element and a group 14 element.

51. The amorphous transparent, electrically conductive layer according to claim 32, wherein $M_1$ and $M_2$ are selected from the group consisting of Al, Ga, In, Tl, Si, Ge, Sn and Pb.

52. The amorphous transparent, electrically conductive layer of claim 32, wherein the layer consists of one or more compounds of formula 1.

53. A transparent, electrically conductive layer according to claim 41, wherein the compound of formula 1 is tri(tert-butoxy)indium stannite ($In(O^tBu)_3Sn$).

54. A product comprising a solid substrate having applied thereon the transparent, electrically conductive layer according to claim 42, wherein the solid substrate comprises glass, quartz glass, metal, stone, wood, concrete, paper, textile or plastic.

55. A product according to claim 54, wherein the substrate is cooled.

56. A product according to claim 54, wherein the solid substrate comprises plastic, which is a polyester, a polyamide, a polyamide, a polyacrylate, a polycarbonate (PC), a polyether sulphone (PES), a polyether ether ketone (PEEK), a polyvinyl chloride (PVC), a polyethylene (PE), a polypropylene (PP), a polyacetal (POM) or a mixture of these polymers.

57. A product according to claim 54, wherein the plastic is polyester, which is a polyethylene terephthalate (PET), a polyethylene naphthalate (PEN), a polybutylene terephthalate (PBT), a polyhydroxybutyrate (PHB) or a mixture of these polyesters.

58. A product according to claim 54, wherein the plastic is polyamide, which is a polyamide 6, a polyamide 6.6, a polyamide 11, a polyamide 12 or a mixture of these polyamides.

59. A product according to claim 54, wherein the plastic is polyacrylate, which is a polymethyl methacrylate (PMMA).

60. A product according to claim 54, wherein the compound of the formula 1 is applied by flexographic printing, inkjet printing, offset printing, screenprinting, spraying, pad printing, thermal transfer printing, laser printing, spin-coating, dipping, flow-coating, knife-coating or casting.

61. A product according to claim 54, wherein the compound of the formula 1 is applied to the substrate in the form of a plurality of layers in succession.

62. A product according to claim 54, wherein a plurality of layers which have identical or different compositions are applied successively to the substrate.

63. A product according to claim 62, wherein the composition is consolidated after each application.

64. An article comprising the electronic component according to claim 47, which article is a display, illumination module, photovoltaic element, touch-sensitive screen, resistance heating element, infrared protective film, antistatic casing, chemical sensor, or electromagnetic sensor.

65. A process for producing an amorphous transparent, electrically conductive layer, comprising forming a layer comprising at least one compound of the general formula 1

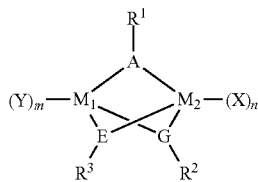

1 wherein the substituents are each defined as follows:
$M_1$, $M_2$: identical or different metals in the 0 to 4 oxidation states;
A, E, G: identical or different metals or nonmetals,
X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$,
n, m: identical or different numbers in the range of 0-4.

66. The process according to claim 65, wherein formula 1 $M_1$ and $M_2$ are independently selected from the group consisting of a group 13 element and a group 14 element.

67. The process according to claim 65, wherein formula 1 $M_1$ and $M_2$ are selected from the group consisting of Al, Ga, In, Tl, Si, Ge, Sn and Pb.

68. A process for producing an amorphous transparent, electrically conductive layer, comprising:
A) applying a solution of at least one compound of the formula 1 to a substrate from a liquid formulation or via the gas phase to form a layer

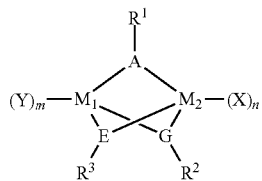

1 wherein the substituents are each defined as follows:
$M_1$, $M_2$: identical or different metals in the 0 to 4 oxidation states;
A, E, G: identical or different metals or nonmetals,
X, Y, $R^1$, $R^2$, $R^3$: identical or different metals or nonmetals, identical or different, branched or unbranched, saturated or unsaturated, aliphatic or aromatic, heteroaliphatic or heteroaromatic, substituted or unsubstituted organic or organometallic groups, which may also be bonded via heteroatoms or functional groups to $M_1$ and/or $M_2$,
n, m: identical or different numbers in the range of 0-4,
B) optionally, removing one or more of solvents and additives by energy input, then
C) aftertreating the layer by energy input.

69. The process according to claim 68, wherein formula 1 $M_1$ and $M_2$ are independently selected from the group consisting of a group 13 element and a group 14 element.

70. The process according to claim 68, wherein formula 1 $M_1$ and $M_2$ are selected from the group consisting of Al, Ga, In, Tl, Si, Ge, Sn and Pb.

* * * * *